United States Patent
Lee et al.

(10) Patent No.: US 9,505,612 B2
(45) Date of Patent: Nov. 29, 2016

(54) METHOD FOR THIN FILM ENCAPSULATION (TFE) OF A MICROELECTROMECHANICAL SYSTEM (MEMS) DEVICE AND THE MEMS DEVICE ENCAPSULATED THEREOF

(71) Applicant: Agency for Science, Technology and Research, Singapore (SG)

(72) Inventors: Jae-Wung Lee, Singapore (SG); Jaibir Sharma, Singapore (SG); Navab Singh, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/577,337

(22) Filed: Dec. 19, 2014

(65) Prior Publication Data

US 2015/0175408 A1   Jun. 25, 2015

(30) Foreign Application Priority Data

Dec. 19, 2013  (SG) ................. 201309427-1

(51) Int. Cl.
  *H01L 29/00*  (2006.01)
  *B81C 1/00*  (2006.01)

(52) U.S. Cl.
  CPC ... *B81C 1/00293* (2013.01); *B81C 2203/0136* (2013.01); *B81C 2203/0145* (2013.01); *H01L 2924/1461* (2013.01)

(58) Field of Classification Search
  CPC .............................................. H01L 2924/1461
  See application file for complete search history.

(56) References Cited

U.S. PATENT DOCUMENTS

| | | | |
|---|---|---|---|
| 7,268,081 B2* | 9/2007 | Yang | B81C 1/00357 257/E21.122 |
| 8,227,285 B1* | 7/2012 | Yang | H01L 22/12 438/200 |
| 8,802,473 B1* | 8/2014 | Chu | B81B 7/02 257/415 |
| 9,260,295 B2* | 2/2016 | Chu | B81B 7/02 |
| 2002/0001871 A1* | 1/2002 | Cho | B81C 1/0019 438/98 |
| 2004/0227201 A1* | 11/2004 | Borwick, III | B81C 1/00238 257/414 |
| 2004/0248344 A1* | 12/2004 | Partridge | B81C 1/00333 438/127 |
| 2005/0112843 A1* | 5/2005 | Fischer | H01L 21/2007 438/455 |
| 2005/0176179 A1* | 8/2005 | Ikushima | H01L 37/02 438/125 |
| 2006/0246631 A1* | 11/2006 | Lutz | B81B 3/0005 438/127 |
| 2007/0032089 A1* | 2/2007 | Nuzzo | H01L 21/02628 438/725 |
| 2007/0138395 A1* | 6/2007 | Lane | G01J 1/04 250/353 |
| 2010/0190301 A1* | 7/2010 | Delapierre | B81C 1/00293 438/124 |

(Continued)

*Primary Examiner* — Ngan Ngo
(74) *Attorney, Agent, or Firm* — Schwegman Lundberg & Woessner, P.A.

(57) ABSTRACT

A method for thin film encapsulation (TFE) of a microelectromechanical system (MEMS) device, including providing a substrate; forming a MEMS device on the substrate; forming one or more etching channels adjacent to the MEMS device; providing one or more cavities below the MEMS device; and forming one or more cavities above the MEMS device.

11 Claims, 9 Drawing Sheets

(56) References Cited

U.S. PATENT DOCUMENTS

| | | | |
|---|---|---|---|
| 2010/0295138 A1* | 11/2010 | Montanya Silvestre | B81C 1/00246 257/415 |
| 2010/0314668 A1* | 12/2010 | Ollier | B81C 1/00246 257/252 |
| 2012/0098074 A1* | 4/2012 | Lin | B81C 1/00333 257/414 |
| 2012/0261830 A1* | 10/2012 | Chu | B81C 1/00039 257/774 |
| 2013/0193536 A1* | 8/2013 | Arai | B81C 3/00 257/419 |
| 2014/0084482 A1* | 3/2014 | Hu | H01L 24/06 257/774 |
| 2014/0103461 A1* | 4/2014 | Chu | H01L 24/18 257/415 |
| 2014/0264474 A1* | 9/2014 | Chu | B81C 1/00158 257/254 |
| 2014/0264744 A1* | 9/2014 | Chu | H01L 27/0629 257/532 |
| 2014/0268523 A1* | 9/2014 | Gogoi | H01L 27/14 361/679.01 |
| 2014/0340900 A1* | 11/2014 | Bathurst | F21K 9/00 362/249.02 |
| 2014/0361388 A1* | 12/2014 | Chan | B81B 3/0021 257/416 |
| 2015/0041927 A1* | 2/2015 | Geisberger | B81B 3/0027 257/415 |
| 2015/0102390 A1* | 4/2015 | Liu | H01L 27/092 257/254 |
| 2015/0187793 A1* | 7/2015 | Huang | H01L 21/84 257/348 |
| 2015/0270180 A1* | 9/2015 | Yang | H01L 21/82387 438/198 |

* cited by examiner

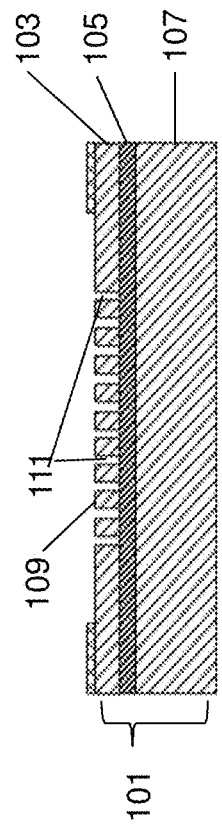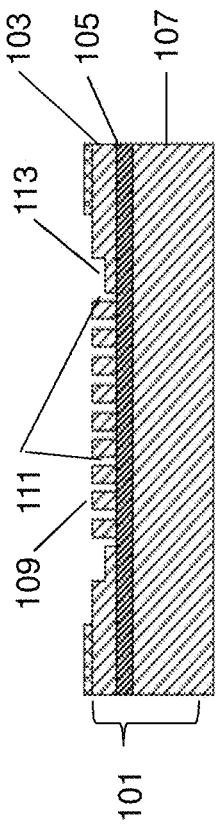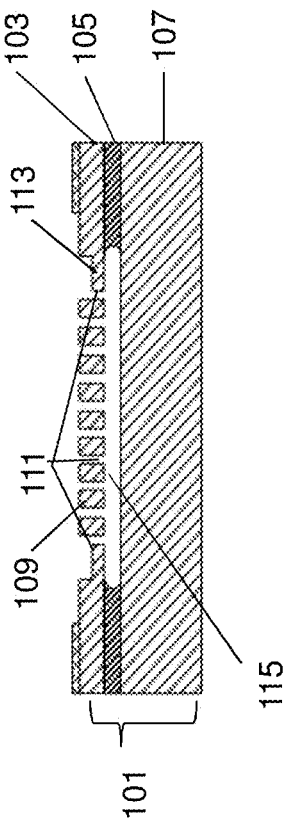

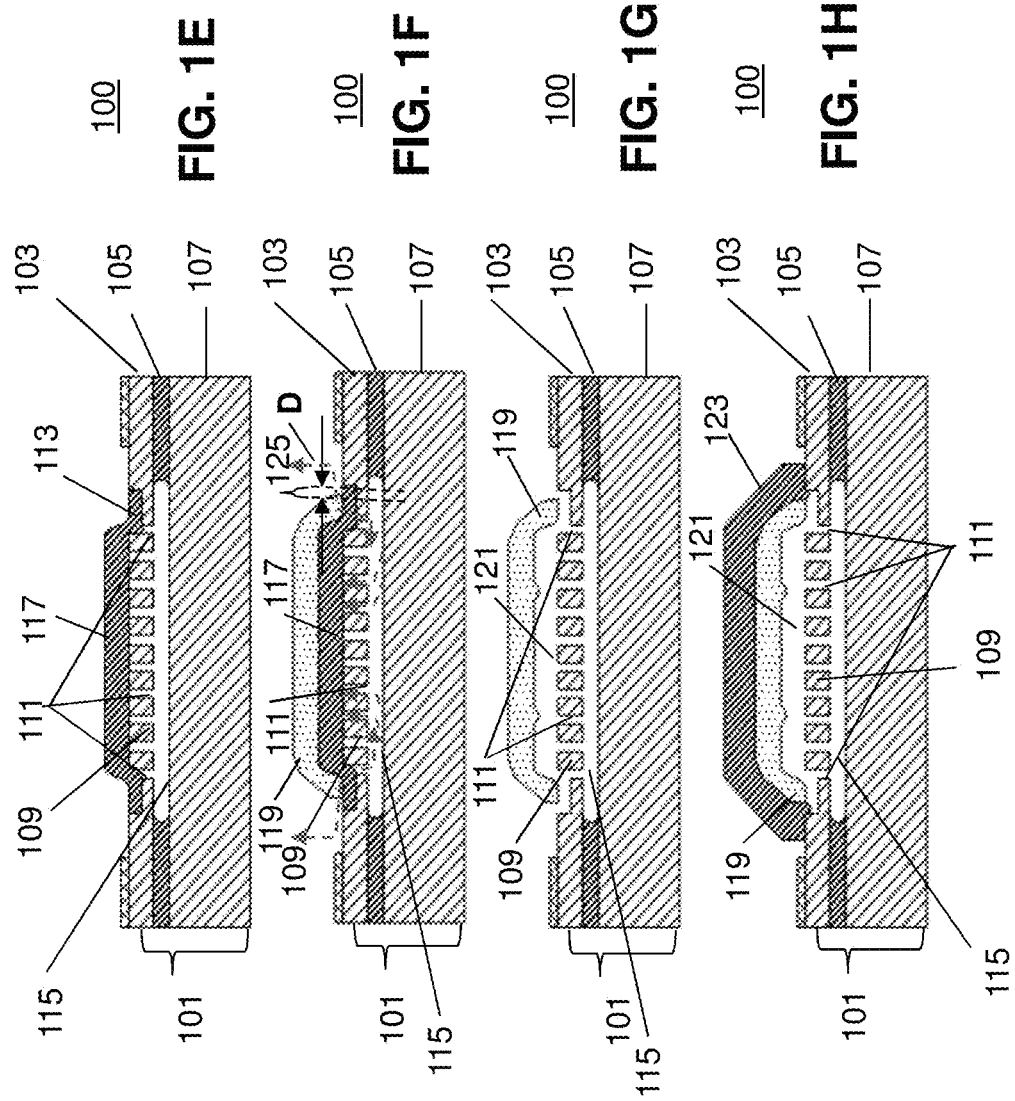

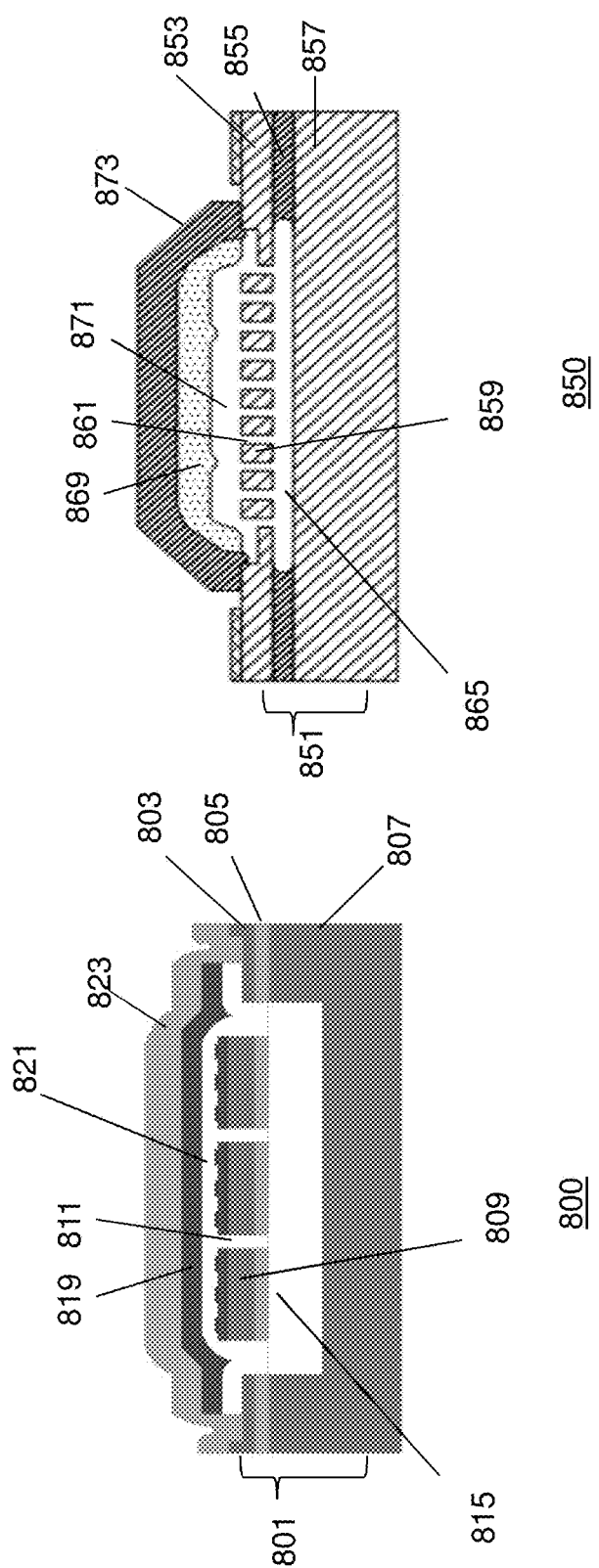

METHOD FOR THIN FILM ENCAPSULATION (TFE) OF A MICROELECTROMECHANICAL SYSTEM (MEMS) DEVICE AND THE MEMS DEVICE ENCAPSULATED THEREOF

CLAIM OF PRIORITY

This application claims the benefit of priority of Singapore Patent Application No. 201309427-1, filed on Dec. 19, 2013, the benefit of priority of which is claimed hereby, and which is incorporated by reference herein in its entirety.

TECHNICAL FIELD

The present application relates to thin film encapsulation (TFE) of microelectromechanical system (MEMS) devices and devices encapsulated thereby.

BACKGROUND

MEMS devices have achieved great attention in the last decade for their board use in many smart systems. The MEMS devices have been utilized for various applications like radio frequency (RF) devices, inertial sensors, optics devices and biomedical systems. In order to strengthen their reliability, these MEMS devices require special protection, such as protection for controlling operating conditions, protection of devices from contamination during dicing, and protection of MEMS fragile hanging structures from harsh environments. Due to the above requirements, MEMS device packaging in great demand is preferred under vacuum conditions or in a controlled atmosphere. Conventional MEMS device packaging uses wafer bonding techniques, which requires a wide dicing area and has low yield during dicing. The MEMS devices packaged thereby have greater thickness due to the wafer bonding techniques, therefore resulting in few devices produced per wafer.

An alternative technique of MEMS packaging/encapsulation to substitute wafer bonding techniques is thin film encapsulation (TFE), as it helps to reduce the thickness and area of a packaged device, as well as the cost of the final device by the elimination of a capping wafer. The encapsulation technique simply uses deposition, etching and release steps of surface micromachining approaches used for MEMS device fabrication. However, conventional encapsulation techniques have drawbacks, such as requiring a long time to release a sacrificial layer and forming mass loading force on the packaged MEMS devices during the sealing process. Conventional TFE techniques have several approaches which differ on the locations of etching channels to remove the sacrificial layer. One of the conventional approaches is to have etching channels all over as well as at the center of the device. In this approach, the sacrificial material can be removed uniformly in a short time. However, this approach suffers from an issue of damaging or mass loading on critical MEMS devices, such as film bulk acoustic resonators (FBARs), as the sealing material will get deposited on the MEMS devices through etch channels that present on the top of the MEMS devices. The other approach is to have etching channels at the side of the MEMS devices. This side etching channel approach may be good at preventing damage from mass loading, but has a disadvantage of a longer release time than regular approaches, as the sacrificial material located deep inside near the MEMS device cannot be efficiently removed through side channels.

Therefore, what is needed is a robust TFE structure and method which solves both the above drawbacks simultaneously, namely which prevents the mass loading on the MEMS devices and enables fast release of the sacrificial layer.

SUMMARY

According to a first aspect of the present application, there is provided a method for thin film encapsulation (TFE) of a microelectromechanical system (MEMS) device, including providing a substrate; forming a MEMS device on the substrate; forming one or more etching channels adjacent to the MEMS device; providing one or more cavities below the MEMS device; and forming one or more cavities above the MEMS device.

According to a second aspect of the present application, there is provided a thin film encapsulated microelectromechanical system (MEMS) device which includes a MEMS device formed on a substrate; one or more cavities formed above and/or below the MEMS device; a cap layer formed over the MEMS device; and a sealing layer formed over the cap layer; wherein one or more etching channels are formed adjacent to the MEMS device and under the cap layer.

BRIEF DESCRIPTION OF THE DRAWINGS

Example embodiments of the invention will be better understood and readily apparent to one of ordinary skill in the art from the following written description, by way of example only, and in conjunction with the drawings. The drawings are not necessarily to scale, emphasis instead generally being placed upon illustrating the principles of the invention, in which:

FIGS. 1A-1H show a schematic of a process flow in which an embodiment of thin film encapsulation (TFE) of a microelectromechanical system (MEMS) device, in accordance with the present application, may be performed. Each of FIGS. 1A-1H represents a stage of the process flow.

FIGS. 8A and 8B respectively shows a cross sectional view of the first embodiment and the second embodiment of a TFE at the stage of the method shown in FIG. 1H, wherein the sacrificial layer has been removed and a sealing layer has been deposited on the cap layer.

DETAILED DESCRIPTION

Figure 2A:
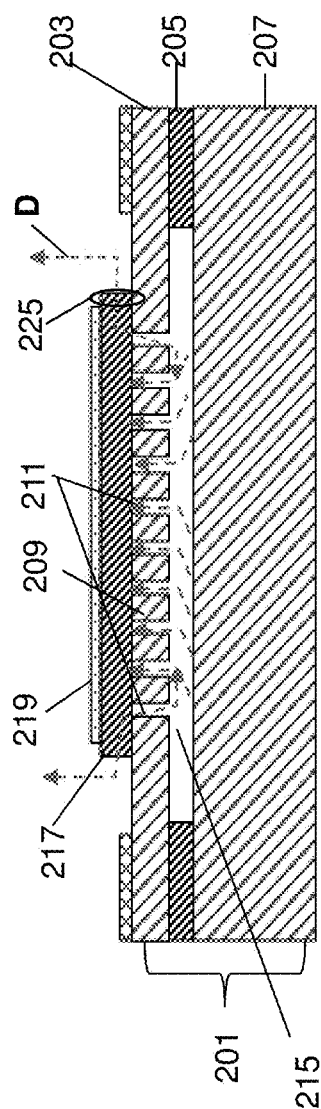
FIGS. 2A-2C respectively shows an alternative of the method for the TFE of a MEMS device. All FIGS. 2A-2C correspond to the stage of the schematic of the process flow shown in FIG. 1F, being on the moment when a cap layer has just been mounted on a sacrificial layer, wherein etching directions in broken line connected arrows are illustrated.

The present application is directed to a method for thin film encapsulation (TFE) of a microelectromechanical system (MEMS) device that is configured to fast release the encapsulated MEMS device, and the MEMS device fabricated thereof. The following schematic of a process flow, illustrated in FIGS. 1A-1H, in which an embodiment of thin film encapsulation (TFE) of a MEMS device may be performed, is exemplified on a silicon on insulator (SOI) wafer. However, it should be appreciated by a skilled person that the SOI wafer can be a cavity wafer, as shown as alternatives in FIGS. 2A-2C, or other types available.

As illustrated in the stage of FIG. 1A, a substrate 101 is provided. In the present embodiment, this substrate 101 is exemplified as a SOI wafer, which comprises a silicon substrate layer 107, an insulator layer 105 and a silicon layer 103. At this stage, one or more electrodes 127 may be fabricated by depositing electrode material on the top side of the substrate 101, and more preferably, on the top side of the silicon layer 103. The electrode material may then be patterned to a suitable form, as exemplified in FIG. 1A.

A MEMS device can also be fabricated on the substrate 101. As exemplarily shown in FIG. 1B, a MEMS device is formed in the silicon layer 103 by etching the silicon layer 103 in a desired pattern or configuration. During forming the MEMS devices, one or more channels are formed for subsequent etching use. In the present embodiment as illustrated in FIG. 1B, the MEMS device is formed at the center part of the substrate 101, whereas the one or more etching channels 111 are formed adjacent to the MEMS devices. Besides the etching channels 111, one or more sidewall etching channels may also be formed, in order to provide an access for subsequently fast releasing the encapsulated MEMS device, which will be described in FIG. 1G.

As illustrated in FIG. 1C, one or more sidewall etching channels 113 are formed on the silicon layer 103 at a periphery of the MEMS device 109. In the present embodiment, the forming of the sidewall etching channels 113 may be provided by partially etching the silicon layer 103 of the SOI substrate 101.

The one or more etching channels 111 and/or the one or more sidewall etching channels 113 will provide an advanced efficient release of the MEMS device 109, which will be illustrated in FIG. 1F, FIGS. 2A-2C and FIGS. 4 and 6. To collaborate with the one or more etching channels 111 and/or the one or more sidewall etching channels 113, one or more cavities 115 are provided below and/or above the MEMS device 109.

Figure 2B:
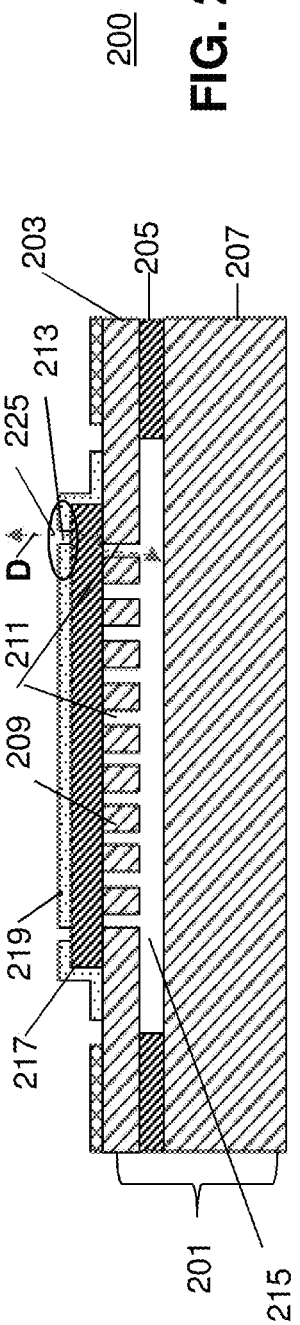
Figure 2C:
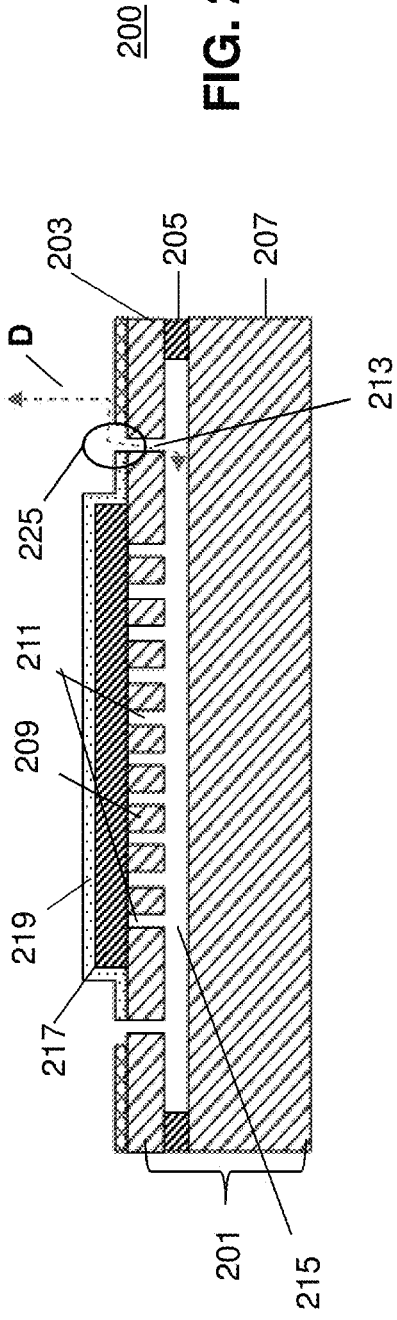

FIG. 1D illustrates an exemplary stage of etching the insulator layer 105 so as to provide one or more cavities 115 below the MEMS device 109. It should be appreciated to the skilled person in the art that, other than etching the insulator layer 105 to form the cavities 115 below the MEMS device 109, one can use a cavity wafer which has pre-etched cavities in the silicon substrate layer 107 and/or the insulator layer 105, to substitute the SOI wafer to work as the substrate 101. The embodiments of using a cavity wafer to substitute the SOI wafer as the substrate 101 are illustrated in FIGS. 2A-2C.

A sacrificial layer 117 then may be deposited over the MEMS device 119. The sacrificial layer 117 is composed by sacrificial materials that are able to be removed by etchants, such as an etch gases. In the present embodiment, the sacrificial materials can be selected from a group comprising a-Si, Mo, SiO2, Ru, and similar sacrificial material. The etch gases can be selected from a group comprising XeF2, V-HF, Ozone, and similar etching material.

As illustrated in FIG. 1E, the sacrificial layer 117 covers the MEMS device 109. Due to the flowing nature of the sacrificial materials, the sacrificial layer 117 may flows into the one or more etching channels 111 adjacent to the MEMS devices, forming a partial filling of an upper part (exemplarily shown as 411A in FIG. 4) of the etching channels 111. If the sidewall etching channels 113 have been formed in the silicon layer 103 at a periphery of the MEMS device 109, the sacrificial layer 117 may also fill the sidewall etching channels.

A cap layer 119 may then be deposited over the sacrificial layer 117. It is necessary that the cap layer 119 is composed of a group of materials that are different than those used in the sacrificial layer 117, and are inert to the etchants used in the present embodiments for removing the sacrificial layer 117.

As illustrated in FIG. 1F, the cap layer 119 is deposited over the sacrificial layer 117 to the extent that one or more exposures 125 of the sacrificial layer are formed. In other words, one or more portions 125 of the sacrificial layer 117 formed between the cap layer 119 and the silicon layer 103 are not covered by the cap layer 119. The exposures 125 of the sacrificial layer can be one or more holes, in the form of a square or a circle or any shape, which can be used as one or more contact points for the etchants to react and remove the sacrificial layer 117 at the next stage. In the present embodiment as shown in FIG. 1F, the one or more exposures 125 are formed between the cap layer 119 and the silicon layer 103. It should be appreciated to the skilled person in the art that the exposures can also be formed in the cap layer 219, as illustrated in FIG. 2B. It also can be appreciated to the skilled person in the art that the cap layer 219 can cover the whole sacrificial layer 217, while one or more exposures can be formed in the sidewall of the silicon layer 203, as illustrated in FIG. 2C.

After the cap layer 119 has been deposited and one or more exposures 125 have been formed, the etchants as described above can be provided to enter the one or more cavities 115 below the MEMS device 109 through the one or more exposures 125 and via one or more sidewall etching channels 113 and/or one or more etching channels 111.

In FIG. 1F, a plurality of broken line connected arrows are illustrated to indicate the circulation direction D of the etchants entering and departing the TFE 100 of the MEMS device 109. It is shown that the etchants enter the TFE 100 through the one or more exposures 125 as described above, etch and remove the sacrificial layer 117 which fills and sits on the sidewall etching channels 113 to enter the one or more etching channels 111 adjacent to the MEMS device 109. In this release process, after removal of the sacrificial material from the sidewall etching channels 113, the etchants start to remove the sacrificial material from the bottom of the one or more cavities 115 through the one or more etching channels 111 formed in the MEMS device 109, as well as through the one or more etching channels 111 adjacent to the MEMS device 109. The details of the process are described as follows.

After making the one or more etching channels 111 adjacent to the MEMS device 109, the etchants flow into the one or more cavities 115 below the MEMS device 109, to remove the sacrificial material from the bottom of the one or more cavities 115 as well as from the side of the one or more cavities 115. The etchants find its their way up through the one or more etching channels 111 within and adjacent to the MEMS device 109 which aid in fast and uniform removal of sacrificial layer 117 all over the MEMS device. Accordingly, the etchants subsequently react with and remove the sacrificial layer 117 deposited over the MEMS device 109 and/or the upper part 411A of the etching channels 111 (or 411 in FIG. 4). In accordance with the circulation direction D illustrated, once the etching and removing of the sacrificial layer 117 has been completed, the etchants will flow out of the TFE 100 through the one or more exposures 125. In this method, the removal of the sacrificial layer 117 becomes faster due to the etching of the sacrificial layer 117 not only from the bottom of the MEMS device 109 through the cavity 115, but also through the etching channels 111 that are adjacent to the MEMS device. Further, as illustrated in FIG. 1F and FIGS. 2A-2C, since the one or more exposures are formed only at a side position on the silicon layer 103, straight crashing avenues to the MEMS device 109, 209 are therefore avoided. The etching and removal of the sacrificial layer 117 is therefore not only efficient but also gentle to the MEMS device 109, 209. Therefore, this technique helps in fast release of the MEMS device 109 through the sidewall etching channels 113 without mass loading on MEMS device.

FIG. 1G illustrates the result of the circulation of the etchants in and out of the TFE 100. As shown in FIG. 1G, since the sacrificial layer 117 has been removed at the stage shown in FIG. 1F, one or more cavities 121 are formed over the MEMS device 109 and the cap layer 119 that was deposited over the sacrificial layer 117 remains over the one or more cavities 121. The one or more cavities 121 over the MEMS device 109 provides space for the movements of the MEMS device 109, which will advantageously improve the application accuracy of the various MEMS applications, such as when the MEMS 109 is used as RF-MEMS devices and biomedical sensors. As the person skilled in the art will understand, the one or more cavities 121 over the MEMS device 109, as well as the one or more cavities 115 below the MEMS device 109 are used for the deformation of the MEMS device 109 during actuation.

As illustrated as a final stage of the present embodiment, FIG. 1H depicts a sealing layer 123 being provided over the cap layer 119. The sealing layer 123 is composed of sealing materials selected from a group of SiO2, SiN, a-Si, Al, Ti, Ta, AlN, Polyimide, and similar sealing materials. The sealing layer 123 is deposited over the cap layer 119, extending to and sitting in part on the silicon layer 105. As shown in FIG. 1H, the one or more exposures 125 are the only openings to the MEMS device which is already covered by the cap layer 119 in the previous stages, since the size of the one or more exposures 125 are rather small, it is hard for the sealing layer to penetrate through the one or more exposures 125 to flow onto the MEMS device 109. Thus, a potential contamination or damage of the sealing materials loading onto the MEMS device is avoided in the TFE 100 described in the present embodiment. After the sealing layer 123 turns solid, it then provides protection of the encapsulated MEMS device 109 from various environmental conditions as described above. A TFE 100 of the MEMS device is thereby completed.

FIGS. 2A-2C respectively shows an alternative of the TFE of the MEMS device. In particular, FIGS. 2A-2C all refer to the stage of the schematic of the process flow shown in FIG. 1F and described above, being on the moment when the cap layer 219 has just been mounted on the sacrificial layer 217, wherein etching directions D in broken line connected arrows are illustrated.

As described above, the alternative embodiment illustrated in FIGS. 2A-2C employs a cavity wafer as the substrate 201. The cavity wafer 201 comprises a top silicon layer 201, a silicon substrate layer 207 and an insulator layer 205 which comprises one or more pre-etched cavities 215. Similarly to the embodiment illustrated in FIGS. 1A-1H, in the top silicon layer 203 shown in FIG. 2A-2C, a MEMS device 219 is provided, wherein one or more etching channels 211 are also provided within and adjacent to the MEMS device 209. In FIG. 2A-2C, a sacrificial layer 217 is deposited on the MEMS device and covers a part of the silicon layer 203 that is at a periphery of the MEMS device. In FIG. 2A, a cap layer 219 is deposited on the sacrificial layer 217, to the extent that the side portions of the sacrificial layer 217 are on exposure. When the etchants are provided, the etchants will react with and etch the exposures 225 of the sacrificial layer 217, then enter the one or more pre-etched cavities 215. The etchants will then etch and remove the sacrificial layer 217 through the exposures 225 in a direction D illustrated by a plurality of broken line connected arrows. The etching and removal of the sacrificial layer 217 is thus improved by the etching and removal being efficiently provided by the etchants simultaneously etching the sacrificial layer 217 upwardly from the one or more cavities 215 through the etching channels 211.

FIGS. 2B and 2C are similar to the alternative illustrated in FIG. 2A. In FIGS. 2B and 2C, the cap layer 219 covers the sacrificial layer 217 and extends to the top silicon layer 203. FIGS. 2B and 2C differ on the position of the exposures 225. In FIG. 2B, the exposures 225 are provided on an upper end of a sidewall etching channel 213 formed on the one or more sides of the cap layer 219 that is above yet horizontally external to the MEMS device 219. In FIG. 2C, the exposures 225 are provided on an upper end of a sidewall etching channel 213 formed in the top silicon layer 203, parallel to the etching channels 211, at a periphery of the cap layer 219. For the sake of simplicity, the directions of the etchants circulation are simplified in FIGS. 2B and 2c. It should be appreciated by the skilled person that they are in a similarity to the direction D illustrated in FIG. 2A, in the broken line connected arrows.

Figure 3:
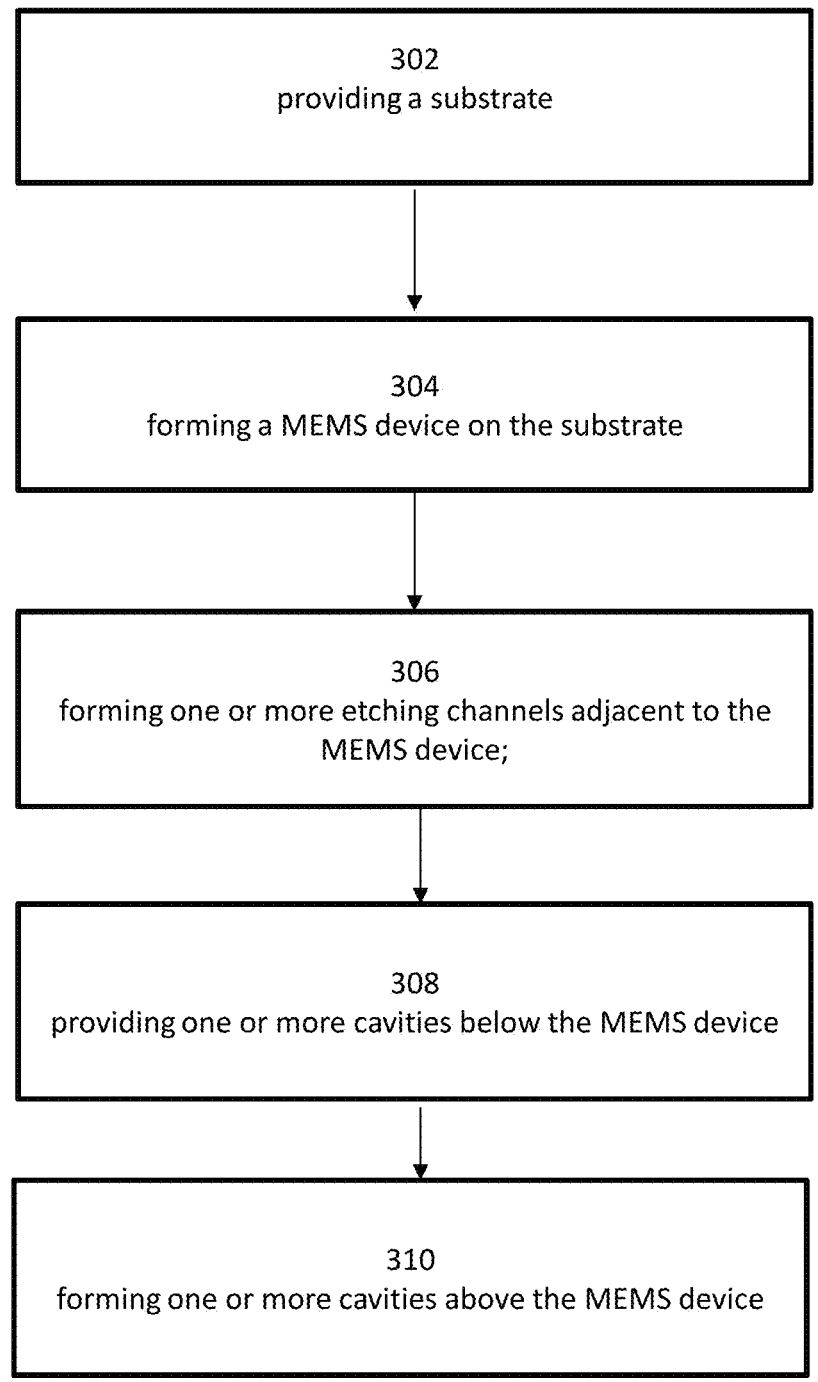
FIG. 3 shows a flowchart depicting steps of a method that allows the MEMS device in accordance with FIGS. 1A-1H to perform the thin film encapsulation (TFE).

FIG. 3 shows a flowchart depicting steps of a method that allows the MEMS device to be encapsulated in accordance with FIGS. 1A-1H and FIGS. 2A-2C. The method includes the following steps as detailed below and described with reference to FIGS. 1A-1H and FIGS. 2A-2B.

In step 302, a substrate 101 is provided. The substrate 101 may be a SOI wafer or a cavity wafer. The substrate 101 may comprises a silicon layer 103, an insulator layer 105 and a silicon substrate layer 107. If the substrate is a cavity wafer 201, one or more cavities 115 may be provided pre-etched in the insulator layer 105 and/or the silicon substrate layer 107.

In step 304, a MEMS device 109 is formed on the substrate 101. The MEMS may be formed in the silicon layer 103 of the SOI wafer 101 or the cavity wafer 201. The MEMS device 109, 209 may comprise one or more etching channels 111, 211 therein.

In step 306, one or more etching channels 111, 211 are formed adjacent to the MEMS device 109, 209. Forming etching channels 111 formed adjacent to the MEMS device 109 may comprises forming one or more sidewall etching channels 113 in the substrate 101.

In step 308, one or more cavities 115, 215 below the MEMS device 109, 209 are provided. The one or more cavities 115 below the MEMS device 109 may be provided by etching the insulator layer 105 of the substrate 101. If the substrate is a cavity wafer 201, one or more cavities 215 are provided as pre-etched.

In step 310, one or more cavities 121, 217 above the MEMS device 109, 209 are formed by depositing a sacrificial layer 117, 217 over the MEMS device 109, 209 and a cap layer 119, 219 over the sacrificial layer 117, 217, then etching the sandwiched sacrificial layer 117, 217 through the sidewall etching channels 113, 213 and/or the cavities 115, 215 below the MEMS device 109, 209, in accordance with the description of FIGS. 1A-1H.

Figure 4:
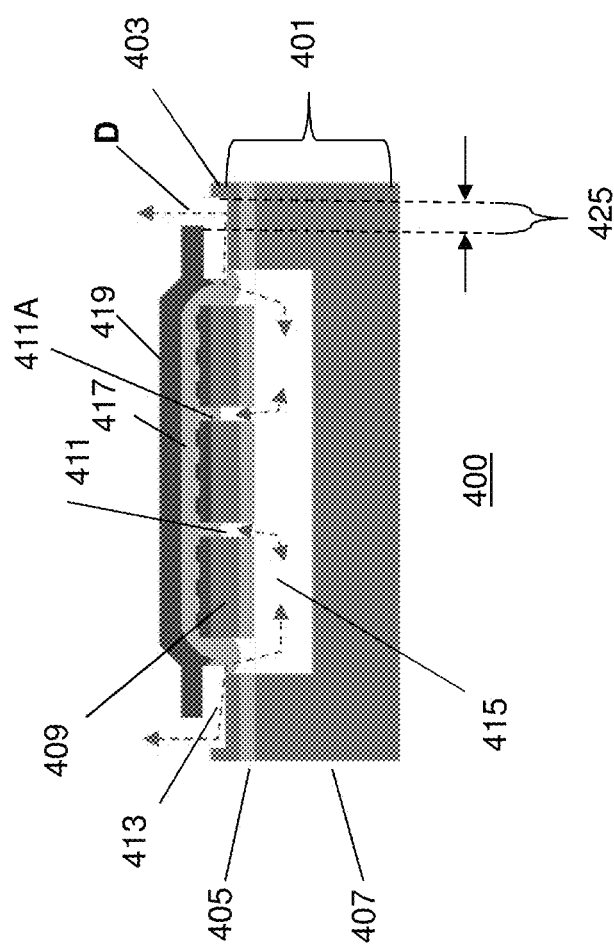
FIG. 4 shows a cross sectional view of a first embodiment of a TFE at the stage of the method shown in FIG. 1F, being on the moment when a cap layer has just been mounted on a sacrificial layer, wherein etching directions in broken line connected arrows are illustrated.

FIG. 4 illustrates an embodiment of the TFE 100 fabricated on a cavity wafer 401. The cavity wafer 401 comprises a silicon layer 403, an insulator layer 405 and a silicon substrate layer 407. In the TFE 400, one or more MEMS devices 409 are formed at the silicon layer 403, maybe in the center, above and adjacent to the insulator layer 405. The one or more MEMS devices 409 are formed and distributed in a discrete manner wherein one or more etching channels 411 are formed between and adjacent to the MEMS devices. One or more sidewall etching channels 413 may also be formed in the silicon layer 403, at a periphery of the MEMS devices 409. Underneath the insulator layer 405 which is located below and adjacent to the one or more MEMS devices 409, a cavity 415 is provided in the silicon substrate layer 407, pre-etched. Above the one or more MEMS devices 409, a sacrificial layer 417 is deposited on the one or more MEMS devices 409. As described above in FIGS. 1A-1H, the sacrificial layer 417 uses sacrificial materials that are able to be removed by etch gases. The sacrificial materials can be selected from a group comprising a-Si, Mo, SiO2, Ru and similar sacrificial materials. The etch gases can be selected from a group comprising XeF2, V-HF, Ozone and similar etching materials. As illustrated in FIG. 4, due to the flowing nature of the sacrificial materials, the sacrificial layer may flows into the channels 411, so that it temporarily blocks an upper part 411A of the etching channels 411 between and/or adjacent to the MEMS devices 409. A cap layer 419 is deposited above the sacrificial layer 417 such that one or more exposures 425 can be formed on one or more sides of the silicon layer 403 of the TFE 100. It should be appreciated that the embodiment of the TFE 400 illustrated in FIG. 4 depicts the TFE at the stage that the cap layer has been mounted on the sacrificial layer, as illustrated in FIG. 1F.

FIG. 4 also depicts a direction D illustrated by a plurality of arrows connected by broken lines. These arrows illustrate etching directions that may be caused by an input of etch gases as mentioned above through one or more sidewall etching channels 413 formed on the silicon layer 403. The process of the etch gas entering through the sidewall etching channels 413 into the one or more cavities 415 pre-etched in the silicon substrate layer 407, causing the etch gas etching and removing the sacrificial layer 417 simultaneously upwardly through the etching channels 411, as shown in the direction D illustrated by a plurality of broken line connected arrows. Upon completion of the etching and removing the sacrificial layer 417, the etch gas will then depart the embodiment of TFE 400 in the direction D.

As described above, the sidewall etching channels 413 in the silicon layer 403 is fabricated by partially etching the silicon layer 403. Or it can further be filled with the same sacrificial material which is deposited as the sacrificial layer 617 in another embodiment using SOI wafer as shown in FIGS. 6 and 7.

Figure 5:
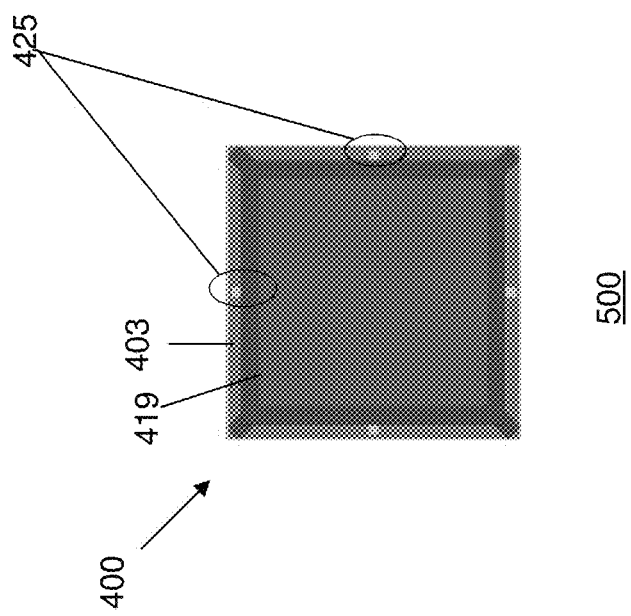
FIG. 5 shows a top view of the first embodiment of the TFE as shown in FIG. 4.

FIG. 5 illustrates a top view 500 of the above described embodiment of the TFE 400, which comprises one or more exposures 425 on the side of the TFE 400. These one or more exposures 425 correspond to the exposures 425 of FIG. 4 that are uncovered between the cap layer 419 and the silicon layer 403.

Figure 6:
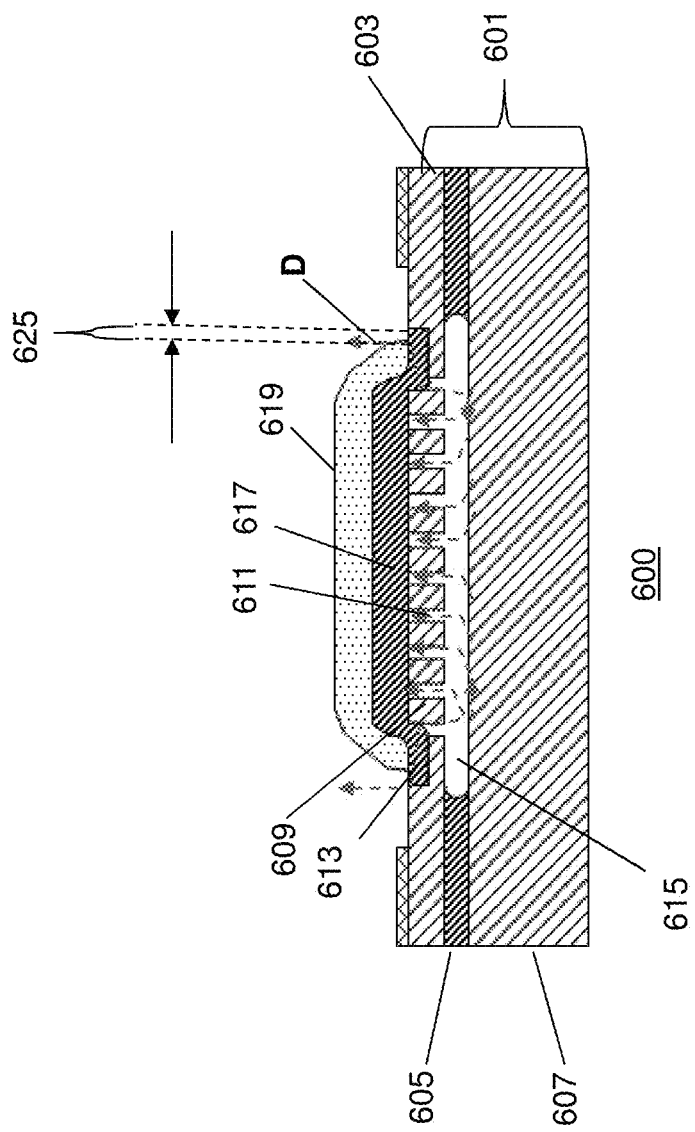
FIG. 6 shows a cross sectional view of a second embodiment of the TFE at the stage of the method shown in FIG. 1F, being on the moment when a cap layer has just been mounted on a sacrificial layer, wherein etching directions in broken line connected arrows are illustrated.
Figure 7:
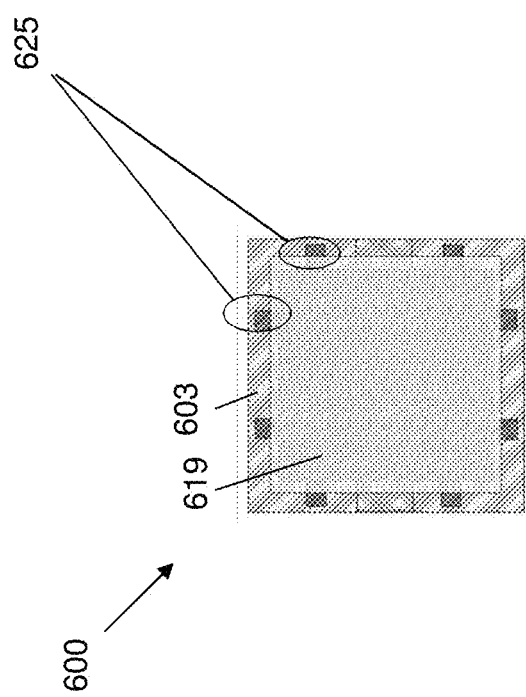
FIG. 7 shows a top view of the second embodiment of the TFE as shown in FIG. 6.

Similar to FIG. 4, FIG. 6 depicts another embodiment of the TFE 600 fabricated on a SOI wafer 601. The SOI wafer 601 comprises a silicon layer 603, an insulator layer 605 and a silicon substrate layer 607. In the TFE 600, a MEMS device 609 are formed in the silicon layer 603, maybe in the center, above and adjacent to the insulator layer 605. The one or more MEMS devices 609 are formed in a manner that one or more etching channels 611 are formed adjacent to the MEMS devices. The etching channels 611 may be formed within the MEMS device 609. Further, one or more sidewall etching channels 613 may also be formed in the silicon layer 603, at a periphery of the MEMS devices 609. Underneath the insulator layer 605 which is located below and adjacent to the one or more MEMS devices 609, a cavity 615 is provided in the silicon substrate layer 607 by etching the insulator layer 605. Above the one or more MEMS devices 609, a sacrificial layer 617 is deposited on the MEMS devices 609. As described above in FIGS. 1A-1H, the sacrificial layer 617 uses sacrificial materials that are able to be removed by etch gases. The sacrificial materials can be selected from a group comprising a-Si, Mo, SiO2, Ru and similar sacrificial materials. The etch gases can be selected from a group comprising XeF2, V-HF, Ozone and similar etching materials. As illustrated in FIG. 6, due to the flowing nature of the sacrificial materials, the sacrificial layer 617 flows into the etching channels 611, so that it extends to and sits on the sidewall etching channels 613 in the silicon layer 603. A cap layer 619 is deposited above the sacrificial layer 617 such that one or more exposures 625 are formed on one or more sides of the silicon layer 603 of the TFE 600. It should be appreciated that the embodiment of the TFE 600 illustrated in FIG. 6 depicts the TFE at the stage that the cap layer has been mounted on the sacrificial layer, as illustrated in FIG. 1F. As described above, the sidewall etching channels 613 in the silicon layer 603 are fabricated by partially etching the silicon layer 603. It is further be filled with the same sacrificial material which is deposited as the sacrificial layer 617.

FIG. 6 also depicts a direction D illustrated by a plurality of arrows connected by broken lines. These arrows illustrate etching directions that may be caused by an input of etch gases as mentioned above through the exposure 625 and one or more sidewall etching channels 613 formed on the silicon layer 603. The process of the etch gas entering through the sidewall etching channels 613 into the one or more cavities 615 formed below the MEMS device 409, causing the etch gas etching and removing the sacrificial layer 617 simultaneously upwardly through the etching channels 611, as shown in the direction D illustrated by a plurality of broken line connected arrows. Upon completion of the etching and removing the sacrificial layer 617, the etch gas will then depart the embodiment of the encapsulated MEMS device 600, at the TFE stage of FIG. 1F, in the direction D.

FIG. 7 illustrates a top view 700 of the above described second embodiment of the TFE 600, which comprises one or more exposures 625 on the side of the encapsulated MEMS device 600. These one or more exposures 625 correspond to the exposures 625 of FIG. 6 that are uncovered between the cap layer 411 and the silicon layer 403.

As shown in FIG. 8A, a cross sectional view of the first embodiment of the TFE 800 fabricated on the cavity wafer 801 is illustrated, being at a final stage after the sacrificial layer 117 has been removed, one or more cavities 821 over the MEMS device 809 have been formed and a sealing layer 823 has been deposited on the cap layer 819. The process of removing the sacrificial layer 117 is depicted on FIG. 1G and described above, whereas the depositing of the sealing layer 823 is depicted on FIG. 1H and described above.

As shown in FIG. 8B, a cross sectional view of the second embodiment of the TFE 850 fabricated on the SOI wafer 851 is depicted, being at a final stage after the sacrificial layer 117 has been removed, one or more cavities 871 over the MEMS device 859 have been formed and a sealing layer 873 has been deposited on the cap layer 869. The process of removing the sacrificial layer 117 is depicted on FIG. 1G and described above, whereas the depositing of the sealing layer 873 is depicted on FIG. 1H and described above.

From the above, a method for thin film encapsulation of the MEMS devices and two preferred embodiments of the encapsulated MEMS device have been described. By virtue of the above described method, removal of the sacrificial layer becomes much quicker due to the etching of sacrificial material from the bottom of device through the cavity in addition to through the sidewall of the MEMS device. This technique helps in fast release of MEMS devices through sidewall etch channel without mass loading on MEMS device.

It will be appreciated by a person skilled in the art that numerous variations and/or modifications may be made to the present invention as shown in the embodiments without departing from a spirit or scope of the invention as broadly described. The embodiments are, therefore, to be considered in all respects to be illustrative and not restrictive.

What is claimed is:

1. A method for thin film encapsulation (TFE) of a microelectromechanical system (MEMS) device, comprising:
    providing a silicon-on-insulator (SOI) substrate comprising a silicon substrate layer, an insulator layer and a silicon layer;
    forming a MEMS device in the silicon layer of the SOI substrate;
    forming one or more etching channels adjacent to the MEMS device;
    then providing one or more cavities below the MEMS device; and
    then forming one or more cavities above the MEMS device,
wherein forming the one or more etching channels comprises forming one or more sidewall etching channels in the substrate by partially etching the silicon layer at a periphery of the MEMS device.

2. The method for TFE of a MEMS device in accordance with claim 1, wherein forming the MEMS device comprising forming one or more etching channels in the MEMS device.

3. The method for TFE of a MEMS device in accordance with claim 1, wherein providing the one or more cavities below the MEMS device comprises removing the insulator layer below the MEMS device by etching the insulator layer below the MEMS device through the etching channels.

4. The method for TFE of a MEMS device in accordance with claim 1, wherein providing the one or more cavities below the MEMS device comprises providing the SOI substrate having one or more cavities pre-etched in the silicon substrate layer and the insulator layer.

5. The method for TFE of a MEMS device in accordance with claim 1, further comprising depositing a sacrificial layer over the MEMS device.

6. The method for TFE of a MEMS device in accordance with claim 5, wherein the sacrificial layer is deposited such that it covers the MEMS device, the etching channels adjacent to the MEMS device, and the sidewall etching channels.

7. The method for TFE of a MEMS device in accordance with claim 5, further comprising depositing a cap layer over the sacrificial layer.

8. The method for TFE of a MEMS device in accordance with claim 7, wherein the cap layer is deposited over the sacrificial layer to the extent that one or more exposures of the sacrificial layer are formed.

9. The method for TFE of a MEMS device in accordance with claim 8, wherein forming the one or more cavities above the MEMS device comprising providing one or more etchants to the one or more exposures of the sacrificial layer so as to remove the sacrificial layer.

10. The method for TFE of a MEMS device in accordance with claim 9, wherein the one or more etchants comprise an etch gas selected from a group comprising XeF2, V-HF and Ozone.

11. The method for TFE of a MEMS device in accordance with claim 7, further comprising providing a sealing layer over the cap layer, wherein the sealing layer extends to and sits in part on the silicon layer.

* * * * *